(12) United States Patent
Verger et al.

(10) Patent No.: US 9,059,378 B2
(45) Date of Patent: Jun. 16, 2015

(54) LUMINOUS GLAZING UNIT

(75) Inventors: Arnaud Verger, Paris (FR);
François-Julien Vermersch, Paris (FR);
Guillaume Lecamp, Paris (FR); Samuel Solarski, la Madeleine (FR); Adèle Verrat-De-Bailleul, Villers-sur-Coudun (FR); Béatrice Mottelet, Compiegne (FR); Christophe Kleo, Attichy (FR); Pascal Bauerle, Roye (FR); Fabienne Piroux, Compiegne (FR); Alexandre Richard, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 13/980,634

(22) PCT Filed: Jan. 17, 2012

(86) PCT No.: PCT/FR2012/050101
§ 371 (c)(1),
(2), (4) Date: Aug. 5, 2013

(87) PCT Pub. No.: WO2012/098330
PCT Pub. Date: Jul. 26, 2012

(65) Prior Publication Data
US 2013/0299856 A1   Nov. 14, 2013

(30) Foreign Application Priority Data
Jan. 21, 2011 (FR) ..................... 11 50478

(51) Int. Cl.
*H01L 27/15* (2006.01)
*H01L 21/00* (2006.01)
(Continued)

(52) U.S. Cl.
CPC .............. *H01L 33/46* (2013.01); *B32B 17/067* (2013.01); *B32B 17/10036* (2013.01);
(Continued)

(58) Field of Classification Search
USPC ...................... 438/23–31, 46–47; 257/80–98, 257/E33.001–E33.077
See application file for complete search history.

(56) References Cited

U.S. PATENT DOCUMENTS 5,836,669 A * 11/1998 Hed ................................ 362/92
2006/0087864 A1   4/2006 Peng et al.
(Continued)

FOREIGN PATENT DOCUMENTS

DE   101 23 263   11/2002
DE   10206613   8/2003
(Continued)

OTHER PUBLICATIONS

International Search Report and Written Opinion as issued for International Application No. PCT/FR2012/050101, dated Apr. 3, 2012.
(Continued)

*Primary Examiner* — Calvin Lee
(74) *Attorney, Agent, or Firm* — Pillsbury Winthrop Shaw Pittman LLP (57) ABSTRACT

A luminous glazing unit including at least one substrate formed by a transparent glazing element; at least one light source; and at least one light extraction device for extracting the light, the extraction device being arranged to create a luminous region, the extraction device being formed by at least one fibrous layer.

27 Claims, 1 Drawing Sheet (51) Int. Cl.
  *H01L 33/46* (2010.01)
  *B32B 17/06* (2006.01)
  *B32B 17/10* (2006.01)
  *F21V 8/00* (2006.01)
  *B60Q 3/00* (2006.01)
  *B60Q 3/02* (2006.01)

(52) U.S. Cl.
  CPC ......... *B32B 17/10761* (2013.01); *G02B 6/006* (2013.01); *G02B 6/0065* (2013.01); *B60Q 3/004* (2013.01); *B60Q 3/0213* (2013.01)

(56) References Cited

U.S. PATENT DOCUMENTS

2007/0098969 A1    5/2007  Ansems et al.
2012/0320621 A1*  12/2012  Kleo et al. .................... 362/558

FOREIGN PATENT DOCUMENTS

| | | |
|---|---|---|
| DE | 102005036869 | 2/2007 |
| EP | 0 919 766 | 6/1999 |
| FR | 2 809 496 | 11/2001 |
| WO | WO 01/79644 | 10/2001 |
| WO | WO 2004/025334 | 3/2004 |
| WO | WO 2007/077099 | 7/2007 |
| WO | WO 2008/035010 | 3/2008 |
| WO | WO 2008/061789 | 5/2008 |
| WO | WO 2010/049638 | 5/2010 |

OTHER PUBLICATIONS

English translation of the Written Opinion as issued for International Application No. PCT/FR2012/050101, dated Apr. 3, 2012.

\* cited by examiner

LUMINOUS GLAZING UNIT

CROSS-REFERENCE TO RELATED APPLICATIONS

This application is the U.S. National Stage of PCT/FR2012/050101, filed Jan. 17, 2012, which in turn claims priority to French Application No. 1150478, filed Jan. 21, 2011. The content of both applications are incorporated herein by reference in their entirety.

The present invention relates to a luminous (or "illuminating") glazing unit, more particularly for vehicles, and especially to an automotive glazing unit comprising light-emitting diodes. The glazing unit may also be used in buildings or in any planar lamp or area lamp application.

Light-emitting diodes (LEDs) were originally used in electronic and electrical lamps or lighting units, and have for a number of years been employed as the light source(s) in automotive vehicle signaling devices (signaling lights, etc.), indicators or positioning lights, in portable lamps or in path lighting. The advantage of diodes is their long lifetime, their luminous efficiency, their reliability, their low power consumption and their small size, making units employing them more reliable and easier to maintain.

More recently, light-emitting diodes have been used in illuminating glazing units for buildings or automobiles. In the latter field, panoramic roofs illuminated by light-emitting diodes are known, as described in document WO 2010/049638. The light emitted by the diodes is introduced into the glazing unit, into part of its thickness forming a waveguide, via one or more of its lateral sides forming the edge face, the light being extracted from the glazing unit via one or other of its main faces ("luminous" face(s)). The waveguide part generally takes the form of a thin plate made of a transparent material, and extraction via one face or surface of the glazing unit is achieved by creating an extraction area on one face or in the thickness of the waveguide, by sandblasting, etching or acid erosion, or by coating with an enamel scattering layer deposited by screen printing, as described in document FR 2 809 496.

Nevertheless, especially in the automotive field, each of these various methods has drawbacks, making them, depending on the circumstances, not very compatible with certain products or requirements.

In particular, sandblasting, etching or acid erosion are, in general, only suitable for treating small areas and/or require long treatment times incompatible with automobile batch production or mass production lines, or may even weaken the glass used. Although enameling allows a uniform lighting effect to be obtained, there are problems with adhesion and degradation of the enamel layer when it is on the external face, and the enamel may prove to be incompatible or interfere with certain required functions, in particular with glazing units comprising thin films (such as glazing units comprising a low-E film) frequently used in the automotive field.

The present invention therefore aims to provide a novel illuminating or luminous glazing unit, in particular comprising light-emitting diodes, especially more suited to the automotive field, in particular a glazing unit that is effective in terms of extraction without however having the drawbacks or incompatibilities seen above, this glazing unit being simple, effective and industrially compatible (easy and quick to produce, reliable, etc.), and advantageously enlarging the range of possible applications.

This aim is achieved according to the invention by the use, as an extraction means (in particular as an extraction layer), of a fibrous or "textile" structure (formed by fibers), in particular formed by at least one textile layer or covering. The invention relates to this structure, to its use as an extraction means in the production of a luminous glazing unit and to the glazing unit thus produced, comprising:

- at least one substrate, formed by at least one preferably transparent (inorganic and/or organic) glazing element, in particular at least one transparent (especially glass or plastic) sheet;
- at least one light source (in particular emitting in the visible and/or ultraviolet); and
- at least one means (or region or area) for extracting the light (said extraction means being arranged in order to create a luminous region on at least one of the faces of the substrate (in particular the main face)), this extraction means being formed by at least one fibrous structure, as mentioned above.

The substrate generally has an edge face, two main faces (largest external faces) and a given thickness. It may be formed by one or more sheets and generally consists of or comprises a part forming a waveguide (for example at least one transparent glass sheet) for guiding (generally by internal reflection, or, if required, total internal reflection through the thickness of the substrate or said part) the light emitted by the one or more light sources (radiation sources).

The substrate (and the waveguide) may be planar but may also be bent or curved (especially in the case of automotive glazing). It may be parallelepipedal, having sheets or main faces that are rectangular, or square or even of any other shape (circular, oval, polygonal, etc.). It may be of various sizes, and it may especially be large, for example having an area greater than 0.5 or 1 $m^2$. Its thickness is generally at least 1 mm, in particular from 2 to 20 mm, for example between 3 and 5 mm, the part forming the waveguide generally having a thickness of at least 0.3 mm, in particular between 0.7 and 3 mm, and in addition no greater than 20 mm.

The substrate (and the waveguide) is preferably formed by transparent elements (sheets, panes, layers, etc.) or materials (in particular vitreous, mineral or organic materials) that are clear or tinted and possibly joined together, as required, by hot or cold bonding, especially by laminating or adhesive bonding, etc. The term "transparent" is understood to mean having a light transmission of at least 3% at least in the (useful) wavelength ranges between 400 nm and 800 nm.

Generally, the substrate comprises one or more mineral glass sheets (of about 0.7 to 6 mm or more in thickness), mineral glass having multiple advantages, in particular a good heat resistance (it may thus be placed near light sources, for example diodes, despite the fact that they get hot; it also meets the requirements of fire safety standards) and a good strength (it is thus easy to clean and scratch resistant). This mineral glass may (depending on the appearance and optical effect desired and on the application of the glazing unit, etc.) be a clear glass (light transmission $T_L$ of 90% or more for a thickness of 4 mm), for example a standard soda-lime glass such as Planilux® from Saint-Gobain Glass, or an extra-clear glass ($T_L$ of 91.5% or more), for example a soda-lime-silica glass with less than 0.05% Fe III or $Fe_2O_3$ such as Diamant® glass from Saint-Gobain Glass or Optiwhite® glass from Pilkington or B270® glass from Schott, or have one of the other compositions described in document WO 2004/025334. The glass may also be darker and may even be a neutral color (colorless), or (slightly) tinted or colored (Venus or TSA glass from Saint-Gobain Glass, etc.); it may be smooth or textured (Albarino® glass from Saint-Gobain Glass, etc.) and may have undergone a chemical or heat treatment such as a toughening, annealing, tempering (especially so as to increase its strength) or bending treatment; it is generally obtained by a float process. It may also, if required, be a glass ceramic, preferably a low-opacity glass ceramic, in particular a clear glass ceramic, for example the glass ceramic KeraLite from Eurokera. In the present description, unless specified otherwise, the term "glass" is understood hereinbelow to mean a mineral glass.

Apart from mineral (or possibly other) glass elements, the substrate may also contain elements based on organic materials, for example made of transparent plastic, for example polycarbonate (PC), polyvinyl butyral (PVB), polyolefins such as polyethylene or polypropylene, polyethylene terephthalate, polyurethane (PU), acrylic polymers such as polymethyl methacrylate (PMMA), polytetrafluoroethylene (PTFE), ethylene-tetrafluoroethylene (ETFE), ionomer resin, copolymer resin, etc. If required, the glazing (or substrate or waveguide) could be essentially plastic (organic sheet(s), for example PC sheet(s)) to decrease bulk and/or weight, or to allow a greater range of shapes to be produced (generally it comprises at least one mineral glass sheet as indicated above).

The organic or mineral glazing elements of the substrate (or possibly of the waveguide) can, if required, form a laminated glazing unit and/or optionally a multiple glazing unit (for example a double glazing unit). In the case of a laminated unit, the substrate (and/or the glazing unit and/or the waveguide) comprises at least one lamination interlayer such as an, advantageously transparent, plastic film (especially made of PVB or (flexible) PU or a plasticizer-free thermoplastic (ethylene vinyl acetate (EVA) copolymer, etc.)), each interlayer for example having a thickness of between 0.2 mm and 1.1 mm, especially 0.38 and 0.76 mm.

For example, the glazing unit may comprise (as a substrate or substrate part or waveguide part) a laminated unit formed by a first transparent mineral, or optionally organic, glass sheet, an organic interlayer (for example transparent PVB, whether tinted or not) and a second mineral, or organic, glass sheet, the sheet placed on the side provided for light extraction preferably being a clear glass sheet, the other sheet and/or the interlayer possibly being clear and/or darker or tinted and/or incorporating a decorative and/or functional film as indicated above (for example a low-E film, etc.), especially for preventing the escape of solar heat.

In the case of a multiple glazing unit (or substrate), the substrate/glazing unit possibly has an internal space that is under vacuum or filled with a gas (air, noble or inert gas, argon for example, etc.), the internal space having a height of less than 10 mm, for example. A spacer, especially located on the periphery of the glazing unit, for example, bounds the internal space, this spacer possibly being a strip, a monolithic strip if required, in particular a frame (especially having a C-shaped, closed, square or rectangular cross section), and if required containing a desiccant. The internal space may moreover be bounded by a peripheral seal, for example a seal made of a butyl mastic, as in patent WO01/79644.

Alternatively to a laminated or multiple glazing structure, the glazing unit (the substrate and/or the guide, respectively) may comprise only a single or monolithic substrate (for example one sheet).

Just like the substrate incorporating it, the waveguide (the part of the substrate guiding the light emitted by the one or more sources) has an edge face and two main faces and may comprise or consist of at least one glass sheet and/or possibly at least one plastic sheet (PC, PMMA, etc.) and it may possibly be laminated or a "multiple" structure. The waveguide may be thin or thick (especially up to 20 mm in thickness) and is preferably transparent. It may be tinted, but is preferably clear or extra clear. To limit optical transmission losses the waveguide may for example be made of a glass having a linear absorption coefficient lower than 2.5 m$^{-1}$ and preferably lower than 0.7 m$^{-1}$ at the wavelength of the guided light. Preferably, the transmission factor (perpendicular to the main faces) about the peak wavelength is 50% or more, especially 70% or more or even 80% or more.

The light is guided by part or all of the substrate (by one sheet, then called the waveguide sheet, or possibly by a number of sheets or films if they have similar refractive indices (the difference between the indices preferably being no greater than 0.03)). For example, in the case of a laminated unit comprising a clear glass sheet, a darker glass sheet and a neutrally colored lamination interlayer, the waveguide may be the clear glass, placed on the light extraction side, or may possibly be both the clear glass and the lamination interlayer if their refractive indices are similar.

As defined according to the invention, the glazing unit also comprises at least one light source (or radiation source) coupled to the waveguide in order to propagate light (by total internal reflection) inside the waveguide (in its thickness), advantageously associated with or coupled to the edge face of the waveguide (alternatively, the light source could possibly be associated with or coupled to one of the main faces (in particular it may be housed in a cavity or slot)), the extraction means (for extracting the light emitted by the source/the guided light) generally being located on one of the faces, in particular one of the main faces, or in the thickness of the guide, as will be explained below, so as to allow at least some of the light to exit via (at least) one of the main faces.

One or more light sources (whether identical or not) may be used, for example electrical light sources and/or light sources consisting of one or more light-emitting diodes (LEDs, etc.). The one or more light sources may be monochromatic (emitting in the blue, green, red, etc.) or polychromatic, or be modified or combined to produce, for example, white light, etc.; they may be continuous or discontinuous, etc.

The light injected into the glazing unit may especially be emitted in the visible and/or UV (preferably in the near UV), the light possibly, in the latter case, being converted into the visible using means for converting the UV light into visible light, for example using at least one layer of phosphors associated with the sources or deposited on the edge face or a face (especially the extraction face) of the substrate, at least one source being arranged so as to allow (in combination with the other elements of the glazing unit) illumination of at least one region of a face (generally a main face) that it is desired to illuminate.

Preferably, the glazing unit according to the invention is a luminous glazing unit illuminated via its edge face, the one or more light sources being arranged along the edge face (or edge of the glazing) of the substrate (especially along the edge face of its waveguide part), the one or more sources possibly being a conventional fluorescent tube, a line of relatively closely spaced diodes (LEDs), one or more optical fibers (positioned along the injection edge of the waveguide with light injection taking place via lateral extraction from the fiber), etc.

The edge face, the corner or the edge of one face of a substrate/waveguide element may comprise a recess in which the sources or chips are placed (it is for example possible (after tempering) to cut the edge of a sheet of a single or laminated glazing unit so as to lodge diodes therein) and/or the sources or chips may be adhesively bonded, especially to the edge face (an adhesive having a refractive index intermediate between the refractive index of the waveguide and that of the external medium or of the lens, for example, is then chosen). The recessed region may form a slot, along the waveguide, for housing a plurality of sources, the slot being emergent or nonemergent on at least one side so as to facilitate side mounting. The sources may be located in a means for protecting them and/or holding them inside the recessed region, especially in a U-shaped strip fastened to the coupling edge face by adhesive bonding, by snap-fastening, by bolts, etc. and occupying part or most of the recessed region.

The edge face may be beveled (angle of at least 45°, in particular of at least 80°, and lower than 90°) so as to redirect the light over a larger extraction region, and/or the edge face bearing the sources and/or the opposite edge face may be made reflective, for example by virtue of an adhesive metal tape or a silver deposit (protected by a varnish or lacquer against oxidation) or comprise a mirror, to ensure optimal recycling of the guided light.

Advantageously (especially for size, environmental, heating, etc., reasons) quasi-point light sources (such as LEDs) are used, these sources advantageously being placed along the edge face of the waveguide (so as to illuminate the guide via its edge face), this configuration being simple, economical and effective.

The diodes may be single semiconductor chips (without encapsulation, lenses or collimators), for example being about 100 microns or a few millimeters in size (for example 1 mm in width, 2.8 mm in length and 1.5 mm in height). The chips may also comprise a temporary or permanent protective package for protecting the chip during handling or for improving compatibility between the chip materials and other materials, and/or they may be encapsulated (for example a low-volume SMD (surface mounted device) encapsulation with a package for example made of epoxy or nylon resin or PMMA encapsulating the chip and having various functions: protecting against oxidation and moisture; scattering, focusing or collimating light; wavelength conversion; etc.).

The total number of diodes is defined by the size and location of the regions to be illuminated, by the light intensity desired and by the required light uniformity.

The diodes, having one and/or the other of these features: electrical contacts on opposite faces or on one and the same face, may emit sideways (parallel to the electrical contacts) in a main emission direction perpendicular or oblique to the emitting face of the chip, in order to promote guiding, or emit in two main emission directions that are oblique to the emitting face of the chip, giving a batwing shape, the two directions being, for example, centered on angles between 20° and 40° and between −20° and −40° or on angles between 60° and 85° and between −60° and −85°, or be inverted, or have a Lambertian emission pattern, etc.

The power of each diode is generally below 1 W, especially below 0.5 W. Each diode may be a "high-power" diode (power above 0.2 W) and/or have a luminosity above 5 lumens, and/or it may be preferable to avoid intense spots of light and to choose a batwing diode, for example.

Generally, the diodes are chosen to have the same main emission direction (for greater simplicity), and to have the same monochromatic or polychromatic spectrum (for more uniform illumination). They (each) generally have a main emission direction substantially parallel to the main faces, especially lying as much as +5° or −5° to the extraction face, the glazing unit possibly also comprising at least one reflector for the diodes, arranged so as to redirect the light toward the extraction layer and/or onto the internal or external faces of the glazing unit.

The diodes may be (pre)assembled on one or more backings (printed circuit boards (PCBs)) or supports provided with electrical supply tracks, these backings or supports possibly being fixed to other supports (strips, etc.). In the case of a glazing unit comprising two glazing elements that are facing, securely joined and spaced apart, the diodes (fixed if required to one or more supports or backings) are possibly secured to a spacer separating the elements, whether the spacer is a peripheral spacer (for example a peripheral frame) or not, the spacer possibly making contact, if required, with one or more sealing means. Each diode backing/support may lie bordering the glazing unit and be fixed (especially to a glazing sheet and/or the waveguide) by pinch-fitting, interfitting, clip-fastening, screw-fastening, adhesive bonding or double-sided adhesive taping, etc. The backing/support is generally thin, especially being 3 mm, 1 mm or even 0.1 mm or less in thickness, or, if required, thinner than the thickness of a lamination interlayer. Several supports may be provided, especially if the regions to be illuminated are very far apart. The backing may be made of a material which is flexible, dielectric or electrically conductive (metal such as aluminum, etc.), it may be made of a composite, a plastic, etc. The diodes may be soldered to tracks that are electrically insulated from the backing and/or to thermal pads on plastic backings, or an electrically insulating and thermally conductive material (thermal grease, thermally conductive adhesive, tape, single-sided adhesive tape, double-sided adhesive tape, etc.) may hold the diodes in place or be interposed to improve heat dissipation and luminous efficiency and increase the lifetime of the diodes. For one or more diode backings (or supports) of total length L0, the total power of the diode group is preferably 30 [W/m]×L [m] or less in order to limit heating and therefore increase the lifetime of the diodes. To increase luminous efficiency, the backing may also have a (flat or inclined) scattering surface around the diodes, for example a lacquer or coat of paint and/or a white reflector, etc.

The glazing unit may also comprise means for sealing against fluid(s), said means being able to protect the chips, and/or the chip support may be perforated so that the chips can be embedded in an adhesive.

The glazing unit may comprise a number of diode groups (and one or more luminous regions). Identical light sources or light sources emitting various wavelengths may also be associated in various configurations and/or numbers, in order to produce different colors or luminous regions of various shapes.

The glazing unit may also comprise a diode that receives command signals (especially in the infrared), so as to allow the illuminating diodes to be remotely controlled and/or the latter may be coupled to piloting means allowing different intensities, a given color or various colors, etc. to be emitted permanently or intermittently.

Sources other than diodes may optionally be used, if necessary in a recess provided for this purpose or on an attached element. These other light sources may be located directly on one of the faces of the substrate (for example the main face), or be adhesively bonded or laminated to another substrate, especially a transparent (glass, etc.) substrate, using a lamination interlayer, especially an extra clear lamination interlayer.

For example, a photoluminescent layer which can be excited in the UV (in particular the near-UV, about 360 to 400 nm) or in the visible may be used, especially a substantially transparent photoluminescent layer, preferably combined with a light-emitting device (LEDs, light-emitting layer, etc.) that produces the exciting radiation, for example based on phosphor particles ($CaS:Eu, Tm^{2+}$, $SrAl_2O_4:Eu^{2+}$, $Y_3Al_5O_{12}$:Ce, etc.), optionally combined to produce white light, or core-shell particles (for example ZnS for the shell and CdSe for the core), the particles possibly being suspended in a matrix (for example an inorganic matrix comprising a silicon alkoxide polymerization product such as tetraethoxysilane (TEOS), tetramethoxysilane (TMOS), methyltriethoxysilane (MTEOS), etc.), the photoluminescent layer possibly, if required, converting the wavelength of one or more other sources (for example visible diodes into UV).

Whatever the light source used, the source is advantageously thin, possibly being as little as a few nanometers or especially tens of nanometers in thickness.

In one advantageous embodiment, one or more sensors coupled to the environment and/or to the glazing unit may be associated with the light sources and/or the power supply system of said glazing unit. For example, a light detector (photodiode, etc.) or a temperature sensor (exterior or interior temperature sensor, sensor on the glass or the light sources) may be used, the sensor used for example controlling the power supply of the light sources via a central processing unit. A measurement value may be defined for the sensor (maximum brightness, for example) above which one of the functions of the glazing unit is turned off (especially light extraction or activation of the light sources). For example, for a higher value, the power supply of the glazing unit is turned off, and for a lower value, the glazing unit or one of its functions (for example its brightness level) may be controlled using the information received from the one or more sensors. The user may also "force" operation of the glazing by deactivating the sensors.

The sensors may be on the inside (for example, of the vehicle) or on the outside. Controlling the glazing unit as a function of the external environment makes it possible, for example, to increase the lifetime of the light sources and other components (polymers, electronic components, etc.). Limiting the operation of the light sources under bright-light and/or high-temperature conditions makes it possible especially to significantly decrease (by at least between 10 and 20° C.) the maximum temperatures to which they may be exposed during use of the product, while preserving the functions of the luminous glazing unit. This coupling also makes it possible to automatically change the brightness of the illumination provided by the glazing to suit external brightness conditions, without the user having to take any action.

For an automotive glazing unit, the power supply of the light sources may for example be controlled by the central processing unit of the vehicle, allowing or preventing them from being turned on as a function of the information received from the light sensor placed, for example, in the top part of the windshield or on a glazing unit such as a sunroof. At times of high brightness (daytime), the brightness level exceeds the maximum value and the light sources remain off; under low-brightness conditions (nighttime), the maximum value is not reached and the sources are then turned on. Whether the sources are turned on/off may also be controlled by a temperature sensor (on the glazing unit or on the light sources, etc.).

In accordance with the definition of the invention, apart from the substrate (in particular at least one transparent glass sheet) forming the base of the glazing unit and the one or more light (or radiation) sources, the glazing unit is characterized by the presence of an extraction means in the form of at least one fibrous (or textile) structure.

This fibrous structure preferably comprises glass fibers and/or optionally polymer (or plastic) fibers. The glass used to form the fibers may be any glass that can be made into fibers, especially E-glass. In the case of polymer fibers, they may especially be polyester fibers or fibers made of polyolefin(s) such as polyethylene or polypropylene. The fibers may have the same or different natures, the same or different lengths and the same or different diameters, the density, weight and structure of the fibers may however vary.

Advantageously, the fibrous structure has a weight per unit area of between 10 and 500 g/m$^2$, preferably between 10 and 100 g/m$^2$, and comprises fibers (textiles) having a diameter of between 1 and 20 microns, especially between 5 and 15 microns. Preferably, the fibrous structure has a thickness of between 10 microns and 1 millimeter.

The fibrous layer preferably has a light transmission $T_L$ higher than 45% and preferably higher than 60%, the light transmission being measured under illuminant D65.

All or part of the fibrous structure may be woven or nonwoven or knitted (it is possible for example to weave patterns or form networks of different mesh size), or even embossed (so as to create a 3D effect), the fibers possibly being formed into a network having hexagonal, square or diamond-shaped meshes, etc. In one advantageous embodiment, the fibrous structure is (chosen from) a woven, nonwoven or knitted textile, for example, and advantageously a veil (or a number of identical or different veils, whether of the same density or not, etc.), thereby ensuring a random distribution of fibers in the extraction layer. Conventionally, the term "veil" is understood to mean a nonwoven formed from completely dispersed filaments. With such a veil, the properties of the layer can be made uniform throughout, especially in terms of light transmission. In addition the veil (more generally the fibrous structure) may be colored, cut into various shapes (it is in particular possible to use a hollow punch to rapidly cut a stack of fibrous structures, etc.), it thus being possible for the extraction area to be continuous or discrete, and for the illuminating patterns to be arranged regularly or randomly from one piece to another.

A nonwoven veil of glass fibers generally contains a binder (possibly incorporating one or more additives, such as pigments responding in the visible or infrared, or phosphorescent or anti-UV pigments, etc.) that binds the fibers and makes the veil stiff enough for it to be handled easily. This binder, which conventionally comprises at least one polymer (examples given below) that is able to bind the fibers, is advantageously transparent (it may also comprise a dye, if required) and may be of any suitable type known. Preferably, the binder does not entirely cover the surface of the fibers such that a light ray passing through the extraction layer meets interfaces between the fibers and the binder or any other medium, especially encapsulating the fibers, as explained below. The binder preferably represents from about 5 to 30 wt % of the veil (especially for a glass veil) or more preferably from 5 to 20%. The expression "encapsulating the fibers" is understood to mean at least partially coating the fibers. Therefore interfaces exist between the material of the fibers and that of the encapsulating medium.

Apart from a woven or nonwoven structure, as described above, the fibrous structure may also be formed by fibers that are not bound together, said fibers being, for example, deposited or sprayed onto a medium (especially a polymer matrix) forming an encapsulating medium and mingling in the manner of a veil, this veil then not containing a binder other than the encapsulating medium.

Advantageously, the glazing unit according to the invention comprises at least one transparent substrate, at least one transparent fibrous structure or layer, and, if required, at least one transparent medium encapsulating the fibers of the structure, the absolute value of the difference between the refractive index of the fibers of the fibrous structure and the refractive index of the encapsulating medium preferably being 0.05 or more, to promote scattering and extraction.

The medium encapsulating the fibers is advantageously a polymer. In particular, it may be a polymer lamination interlayer, for example based on polyvinyl butyral (PVB), ethylene vinyl acetate (EVA), polyurethane, an ionomer or adhesive based on one or more polyolefins or based on one or more transparent thermoplastics such as polyethylene terephthalate (PET), polyethylene naphthalate (PEN), polycarbonate, polymethyl methacrylate, polyamides, polyimides, fluoropolymers such as ethylene tetrafluoroethylene (ETFE) and polytetrafluoroethylene (PTFE), etc. According to a variant, this encapsulating medium may be formed by air or by a liquid having a suitable refractive index, instead of a polymer matrix.

When the encapsulating medium is a polymer matrix, especially formed by a lamination interlayer or a thermoplastic substrate, this polymer matrix may have a thickness larger than or equal to the thickness of the fibrous structure and/or, if required, protrude on one side or both sides of the fibrous structure.

The extraction properties of the fibrous layer may be adjusted by varying one or more parameters among, especially, the weight per unit area of the fibrous structure, the diameter of the fibers, the length of the fibers, the composition of the fibers and the composition of the encapsulating medium. A woven may be used when a highly periodic and uniform structure is desired. Advantageously, the extraction layer has a total light transmission of 80% or more, the total light transmission, comprising direct light transmission and scattered light transmission, being defined according to ISO standard 9050:2003. If required, the extraction layer also especially has a haze value of 40% or more, the haze value of an element, expressed as a percentage, representing the ability of this element to scatter light, the haze values being measured in this case using a hazemeter according to ASTM standard D1003.

The fibrous structure used according to the invention may be laminated with the other elements (glass, polymer, adhesive, etc.) of the substrate, as illustrated below.

The extraction layer may cover/be arranged (directly) on one face (especially a main face) of the substrate, such as the face of the external sheet opposite the illuminated face, or the face of a constituent element (of the substrate/glazing unit) (for example it may be applied to at least one face of the waveguide) and/or it may be located on or be incorporated in the substrate or the element or layer fastened to one face when said element or layer is made of a thermoplastic polymer, with at least part of said element or layer forming the medium encapsulating the fibers.

The extraction layer may be deposited on one face (glazing element, interlayer, etc.) turned toward the interior or exterior, and increases the extraction of light already exiting via the opposite face. In the case of a laminated or possibly multiple substrate/glazing unit, the fibrous structure may be present on any interface between two elements of the substrate. The fibrous layer may be directly associated with (at the glass/air, glass/interlayer interface, etc.) and/or laminated with a plastic (encapsulating medium) to said glazing element, as mentioned above, and/or associated with an adhesive (covering, if required, the plastic) and/or associated with any other element making intimate or optical contact with one face of the guide forming the substrate, etc.

The extraction means may comprise a number of joined or separate fibrous layers. When the one or more fibrous layers are arranged in the thickness of the substrate and/or on an internal face (not turned toward the exterior), they are protected and the external faces of the substrate in contact with the external environment can then be smooth and easily cleaned. The extraction means may also comprise a first fibrous layer (scattering in the visible or UV) and a second layer, for example an external layer, based on particles that scatter in the visible and/or phosphors excited by UV light and emitting in the visible. Additional extraction means may, if required, be provided, for example an extraction face of the glass may also be frosted, sandblasted, screen printed, etc. or the thickness of the guide may also be etched, etc.

The one or more fibrous layers used as the extraction means may cover all or part of one or more faces depending on the illumination or effect desired (they may take the form of strips located on the periphery of one of the faces so as to form a luminous frame, or form logos or patterns, etc.). To provide a uniform illumination, the fractional area covered by the fibers may increase with distance from the light source, for example being 5% near the source and 16% to 55% far from the source.

The extraction means (region, area) may be in a number of pieces, for example identical or different, continuous or discontinuous patterns, and may be any geometrical shape (rectangle, square, triangle, circle, oval, etc.) and may form a graphic or a symbol (arrow, letter, etc.). It is easy to define regions that can be checked for quality and reproduced industrially. The glazing unit may thus comprise a number of extraction regions (fibrous layers) in order to form a number of luminous regions on the glazing unit. As mentioned above, the one or more luminous regions may cover all or part of the (functional, visible) surface of an external element of the glazing unit. A number of regions may therefore emit light whether simultaneously or not or whether they are piloted independently or not. The glazing unit may provide differentiated illumination, for example producing both architectural and decorative illumination, or architectural illumination and a sign or architectural illumination and a display (for example a graphic, alphanumeric symbol, etc.) or a reading light, etc. A range of colors may furthermore be obtained by way of the light sources (in particular LEDs) but also by dyeing the fibers of the fibrous structure.

Preferably, most, or even at least 80% or 90%, of the light (in particular the light reaching the fibrous layer region) is extracted by the fibrous layer. The advantage of distributing the fibers discretely or randomly is that the guide appears transparent when the light source is turned off and can be clearly seen through (it is possible to recognize and identify forms such as faces and symbols), this being particularly advantageous in automotive applications.

In one embodiment, when the light source is turned off, the glazing unit appears transparent or largely (due to the mesh of the fibers) transparent, especially having a light transmission $T_L$ of more than 20%, preferably 50% or more, or even 70% or more, and having a light reflection $R_L$ of 50% or less, preferably 30% or less (in the case, for example, of an illuminating window, the improved illumination of the room not being achieved to the detriment of light transmission).

In another embodiment, when the light source is turned off, the glazing unit may be semireflective or reflective or form a mirror (by means of a mirror fastened to one of the faces of the substrate or a metal sheet or plate made of stainless steel, for example, or a metal film, especially a silver film, located on one of the faces of the substrate (generally opposite the luminous/extraction face)), the glazing unit also possibly forming a mirror when the source is turned on.

One or more other regions may indeed also be present on one and/or other of the glazing-unit elements, for example: a (semi)transparent region and/or a reflective region forming a mirror (produced by depositing a reflective coating), with, if required, an additional scattering means formed by etching the mirror; and/or a translucent or satinized region (protection of privacy, etc.) obtained for example by texturing a glazing element; and/or a region decorated with an opaque and/or colored coating or with a glazing element tinted through its thickness, etc.

The glazing unit according to the present invention meets industrial requirements (in terms of yield, cost, rate, automation, etc.), thus allowing "low cost" production of the unit without sacrificing performance. It may be used both externally and internally.

In one preferred embodiment, the glazing unit according to the invention comprises:
- at least one transparent glass sheet (forming the substrate or part of the substrate or fixed to the or a substrate (formed of at least one other preferably transparent glazing element), for example by way of a lamination interlayer), called the waveguide sheet;
- at least one light source positioned (at the edge of the glazing unit) so as to illuminate the waveguide sheet via the edge face of the latter; and
- at least one means for extracting the light, this extraction means being formed by (a fibrous structure chosen from) a woven, nonwoven or knitted textile applied to at least one face of the waveguide sheet.

In a simple embodiment, the glazing unit may for example comprise a laminated structure composed of an external sheet (intended to be illuminated), a transparent central light-guiding sheet (waveguide sheet), and an internal layer of fibers such as described above. The light source is a plurality of light-emitting diodes mounted on a lateral support fixed to the edge face of the sheets of the laminated unit, a recess being provided, if required, in the central sheet to house the diodes.

Apart from the elements already mentioned, the glazing unit may also comprise other elements and/or layers, for example a light reflector (a part, fixed if required in the internal space, with a reflective surface, the central rays being reflected toward a face by virtue of the reflector, thereby ensuring, if required, higher optical efficiency and/or the reflector recycling light backscattered by scattering means and/or reflected onto the one or more diode backings and/or reflected onto a spacer). The glazing unit may also comprise one or more transparent adhesive resins (for adhesively bonding elements, for example a layer forming an external adhesive, especially a layer made of a material that becomes adhesive on being softened by heating (PVB for example) or made of a material with adhesive sides, such as PE, PU, PET), a protective layer (sheet, film, deposit, etc.) (for example a flexible PU, PE or silicone layer, possibly bonded using acrylic) on the border of one face or extending over said face, a layer (if required an electrically conductive layer) with one or more functions such as: radiation protection (IR, UV); solar control; low-E; scratch resistance; an esthetic (color, patterns, etc.) function, etc. The glazing unit according to the invention has the advantage of being compatible with the use of other layers, this being particularly advantageous in the case of automotive applications.

It may thus be advantageous to incorporate, in the glazing unit or on one of its elements, a coating having a given function, for example an infrared blocker (for example based on silver films flanked by dielectric films, or nitride films, such as TiN or ZrN films, or metal-oxide or steel films or films made of an Ni—Cr alloy) or a low-E coating (for example made of a doped metal oxide such as $SnO_2$:F or indium tin oxide (ITO) or one or more silver films), or an antifog coating (hydrophilic film), or an antifouling coating (photocatalytic coating comprising $TiO_2$ at least partially crystallized in the anatase form), or even an antireflection coating, (for example $Si_3N_4/SiO_2/Si_3N_4/SiO_2$), a hydrophobic/oleophobic layer or oleophilic film, a multilayer for reflecting thermal (solar control) or infrared (low-E) radiation, etc. The module may thus incorporate any functionality known in the glazing field.

It is also possible to texture surfaces, especially by sandblasting, acid etching or screen printing, for functional or esthetic reasons (for example to prevent dazzle), etc.

The glazing unit according to the invention may be used to produce decorative illumination, light for reading, architectural illumination, a sign, a display, etc. It may for example be:
- advantageously intended for automotive or transport vehicles and used as a luminous glazed roof or a luminous window (rear window, side window, windshield), as a luminous glass door, especially in public transportation (trains, subways, trams, buses), or in waterborne or airborne (airplane) transportation, or for highway or urban lighting;
- intended to form architectural glazing, such as an illuminating (or luminous) wall panel, an illuminating window, a ceiling, a luminous floor or wall tile, a luminous glass door, a luminous partition or a staircase step;
- intended for urban furniture, such as a luminous glass part for a bus shelter, balustrade, display case, store window, shelf element, greenhouse, jewelry display, aquarium, railing, step riser, a plinth;
- intended for interior furnishings, such as a luminous bathroom wall, a luminous mirror, a luminous glass part of a piece of furniture, a kitchen worktop, a splashback, a back panel for a cooker hood, floor or wall tiling, a refrigerator element (shelf); or
- intended for any domestic or professional refrigerating, freezing or cooking appliance (such as glass-ceramic plates), etc.

It is also possible to use the glazing units as planar lamps, these planar lamps possibly being back lights employed in flatscreen computer monitors to illuminate liquid crystal displays, or being used in ceilings, flooring or walls, or being lamps for billboards or lamps possibly forming store window shelves or backdrops, etc. The expression "planar lamp" is generally used when the glazing unit consists of two substantially planar substrates, such as glass sheets, on which various layers, forming the lamp, are deposited (for example silver electrodes covered with a dielectric, aluminum films and one or more phosphors, etc.).

The illumination/extraction may be adjusted to obtain ambient lighting, light for reading, a luminous sign, nighttime illumination or illumination of displayed information of any type, i.e. graphics, logos, alphanumeric symbols or other symbols, and may also be remotely activated (detection of the vehicle in a parking lot or elsewhere, indication of (un)locking doors), a safety sign, etc. The light may be continuous and/or intermittent, monochromatic and/or polychromatic, white, etc.

The glazing unit provides illumination of good uniformity and has a satisfactory extraction efficiency. Insertion of the textile defines regions that can be easily controlled for quality and reproduced industrially and makes the extraction easier to control, the reliability of the diodes also being advantageous in intensive-use applications. As already mentioned, the use of the fibrous structure as an extraction area in automotive glazing applications is furthermore compatible with the use of thin films on the glass and with production lines without screen-printing capability, it also allows a rendition and an appearance that cannot be obtained with other extraction means and is compatible with the requirements of glazing units having smooth external surfaces. It furthermore reinforces the glazing if it is used over a large area.

The invention also relates to a vehicle incorporating (or comprising) the glazing unit defined above.

The invention finally relates to a process for manufacturing the glazing unit as defined above, comprising adding at least one fibrous structure, in particular a fibrous layer, to the glazing unit.

In a first embodiment, the layer is deposited on the face of an element (glass sheet for example) of the substrate, said face being oriented toward the interior of the glazing unit. The layer may be deposited directly on the glass or, of course, on layers already deposited on the glass. According to another embodiment, the layer is deposited on the face oriented toward the exterior. It is also possible to deposit a fibrous layer on each side of an element of the substrate.

The fibrous structure may also be incorporated, combined, or encapsulated with/in one or more other layers, in particular plastic and/or adhesive layers. In the case where the encapsulating medium is formed by a transparent thermoplastic polymer, the fibers of the fibrous structure may be encapsulated in the thermoplastic substrate during molding by positioning the fibrous structure in a mold and then injecting the thermoplastic polymer (for example polycarbonate) into the mold. Alternatively, once prepared, the fibrous layer may be embedded in a plastic layer (for example a PVB layer) by compressing the fibrous layer against the plastic layer. The assembly comprising the plastic layer and the fibrous layer embedded in said layer is then incorporated into the glazing unit, in the same way as a conventional lamination interlayer, and this laminated structure is baked in an oven so as to obtain good cohesion between the various layers forming the glazing unit.

In the case where a glass-fiber veil is used, this veil may be formed using a "dry" process or a "wet" process. Such processes for manufacturing glass-fiber veils are well known to those skilled in the art, and they are not described here in greater detail.

The present invention will be better understood and other details and advantages features of the invention will become clear on reading about exemplary luminous glazing units according to the invention, illustrated by the following figures.

For the sake of clarity the various elements of the objects shown have not necessarily been drawn to scale.

Figures 1A, 1B, 1C, 2, 3, 4, 5, 6:
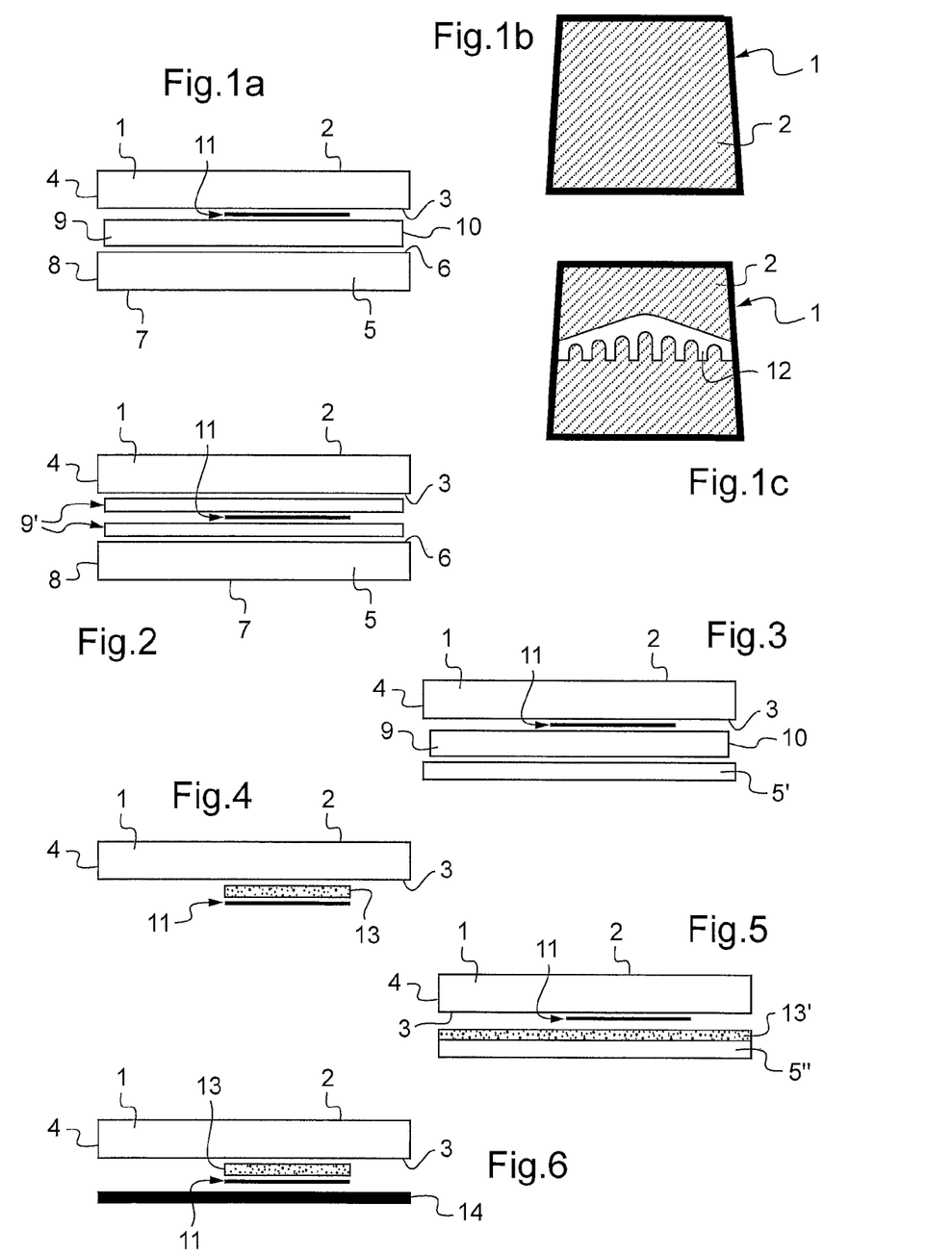
FIGS. 1a, 1b and 1c, which show schematic cross-sectional views and a front view, respectively, of a glazing unit in a first embodiment of the invention.
FIGS. 2 to 6, which show various schematic cross-sectional views of various glazing units according to the invention.

In FIG. 1, the glazing unit according to the invention is a laminated glazing unit comprising, as a substrate:

a first transparent sheet 1, for example a rectangular sheet (300 mm×300 mm in area for example) made of mineral glass, having a first main face 2 and a second main face 3 and an edge face 4 that is preferably rounded (to avoid flaking), for example a sheet of Planilux® soda-lime-silica, glass (sold by Saint-Gobain Glass) having a thickness of 2.1 mm, for example; and a second glass sheet 5 having the same composition and dimensions as the first sheet, or optionally having a tinted composition providing a solar control function (Venus® VG10 or TSA 4+ glass sold by Saint-Gobain Glass, for example) and/or covered with a solar control coating, with a main face 6 opposite the face 3, and another main face 7 and an edge face 8.

The second glass sheet is laminated by way of a lamination interlayer 9, for example made of 0.76 mm thick clear PVB sheet comprising an edge face 10. The glass sheets of the substrate preferably have a linear absorption coefficient of 2.5 $m^{-1}$ or less in the visible (for example they are made of extra clear soda-lime glass having a linear absorption coefficient lower than 0.7 $m^{-1}$ in the visible or near UV).

A strip supporting light-emitting diodes (not shown) lies bordering the glazing unit and is fixed to the first glass sheet (intended, for example, to be the internal sheet placed in the passenger compartment of a vehicle and comprising, if required, a notch) on the edge face 4 (the emitting face of the sources facing the edge face and an adhesive being deposited, if required, on the chips so as to seal them during encapsulation). This support may be a single piece of metal (stainless steel, aluminum) or for example made of thin layers of polyimide, 0.2 mm in thickness. The diodes of each group each have a given main emission direction substantially parallel to the first face, for example equidistant from the first and third faces. By way of example, the (about twenty) diodes each have a power of (about) 0.4 W and lie over a length L0 of 450 mm, giving a power of 20.5 W/m.

A fibrous extraction layer 11 is intermediate between the first sheet and the interlayer (and is for example applied to the first sheet forming the waveguide). The light is especially guided in the thickness of sheet 1 by reflections and is extracted from the first face 2 by means of the fibrous layer. The fibrous layer is advantageously a transparent veil of E-glass fibers. An exemplary glass-fiber veil that may be used is the U50 veil, sold by Saint-Gobain Technical Fabrics, which has a mass per unit area of 50 $g/m^2$.

The glazing unit in FIG. 1 may for example form a terrestrial vehicle fixed panoramic roof, mounted from the outside, the first sheet being on the inside of the vehicle, and extraction preferably occurring via face 2 (oriented for example toward the passenger compartment of a vehicle). When the diodes are turned off, the luminous glazing unit is largely transparent (FIG. 1b), having an overall light transmission $T_L$ of about 85% and a light reflection $R_L$ of about 15%. When the diodes are turned on, the extracted light may form a luminous graphic 12, for example a logo or a trademark, as shown in FIG. 1c, the veil having for this purpose the shape of the desired pattern so as to create the desired symbol.

The glazing unit may also, as a variant, have a plurality of illuminated regions, and/or one or more luminous regions in one or more faces, the luminous region(s) preferably occupying at least 50%, even 80% of the area of at least one face, being of a given geometry (rectangular, square, round, etc.) and/or regularly distributed so as to produce decorative illumination. Generally, the unit advantageously has a single illuminating face 2, forming a light for example. It is also possible to place a mirror opposite the back glass pane. The glazing unit may thus serve as a mirror (especially when the glazing unit is intended for architectural applications) during the day and as a light source at night.

The glazing unit in FIG. 2 differs from the preceding unit by the following technical features:

the glass sheet 1 is laminated to the glass sheet 5 (optionally of different size or shape) by means of two lamination interlayers 9' (or interlayer parts of the same lamination interlayer, as described below) such as preferably (extra) clear PVB layers each 0.38 mm in thickness (or one layer may be clear and the other one tinted), between which the fibrous structure is located. Alternatively the fibrous structure may be embedded/encapsulated in a single interlayer, such as described with regard to the preceding figures, and/or a transparent PVB matrix, the refractive index $n_4$ of which is about 1.48, may encapsulate the veil described with reference to FIG. 1. Thus, the refractive index difference between the fibers of the veil and the matrix is about 0.09. The polymer matrix encapsulates the veil and has substantially the same thickness as the latter. However, it may be thicker than the veil, the latter then being encapsulated in only part of the polymer matrix. The refractive index difference between the fibers of the veil and the encapsulating matrix contributes to the extraction of the light at the interface between the fibers of the veil and the matrix. Extraction related to the haze of the veil and the good off-state light transmission of the layer can be simultaneously adjusted by varying one or more parameters selected from among, especially, the weight per unit area of the veil, the diameter of the fibers of the veil, the composition of the fibers of the veil and the composition of the polymer matrix, so as to obtain a layer having an advantageous compromise between the haze and light transmission. The use of a PVB encapsulating matrix, or any other polymer lamination interlayer, is also advantageous for ensuring the veil or other functional layers are maintained between the glazing elements. This embodiment has various advantages, for example there is no problem with adhesion between the PVB and the glass fibers.

The glazing unit in FIG. 3 differs from that in FIG. 1 by the fact that the second sheet 5' is a polymer film.

The glazing unit in FIG. 4 differs from that in FIG. 1 by the absence of the second sheet and an interlayer, the fibrous structure being bonded to one face of the glass sheet 1 using an adhesive 13 and/or, if required, being covered with the latter.

The glazing unit in FIG. 5 differs from the preceding unit in that the adhesive 13' covers a polymer film 5", the veil 11 being intermediate between the adhesive/polymer assembly and the glass sheet 1, this embodiment being used in the automotive field.

The glazing unit in FIG. 6 differs from that in FIG. 4 in that a protective varnish or lacquer 14 is added to the veil 11 and, if required, to the rest of the face of the glazing unit not covered by the veil.

The glazing unit according to the invention may be used in many applications, in particular in automotive applications (generally in the form of a laminated or monolithic glazing unit) but also possibly in both interior and exterior architectural applications (in particular in the form of an insulating multiple glazing, for example for illuminating building façades, etc.), in planar lamps, etc.

The invention claimed is:

1. An illuminating glazing unit comprising:
a first glass substrate including a first side and a second side opposite said first side;
a light source arranged to illuminate an edge of the first glass substrate so that light emitted by the light source is guided within a thickness of the first glass substrate; and
a fibrous structure arranged over said second side so that the light is extracted from the first side of the first glass substrate by the fibrous structure, the fibrous structure comprising a plurality of fibers extending along different directions in the fibrous structure.

2. The glazing unit as claimed in claim 1, wherein the fibrous structure is formed by a fiber veil.

3. The illuminating glazing unit as claimed in claim 1, wherein at least part of the fibrous structure is formed by a woven, nonwoven or knitted textile.

4. The illuminating glazing unit as claimed in claim 1, wherein the fibrous structure contains a binder that binds the plurality of fibers in the fibrous structure.

5. The illuminating glazing unit as claimed in claim 1, wherein the plurality of fibers are randomly distributed in the fibrous structure.

6. The illuminating glazing unit as claimed in claim 1, comprising a second substrate arranged over the fibrous structure so that the fibrous structure is positioned between the first glass substrate and the second substrate.

7. The illuminating glazing unit as claimed in claim 6, comprising an interlayer made of a resin material and arranged between the first glass substrate and the second substrate.

8. An illuminating or luminous glazing unit, comprising:
at least one transparent glass sheet acting as a waveguide sheet;
at least one light source, positioned so as to illuminate the waveguide sheet via an edge face of the latter; and
at least one extraction means for extracting the light from the waveguide sheet, the extraction means comprising a fibrous structure formed by a woven, nonwoven or knitted textile placed on at least one face of the waveguide sheet, the fibrous structure comprising a plurality of fibers extending along different directions in the fibrous structure, wherein, in use, the light provided by the at least one light source is first guided within a thickness of the waveguide sheet before being extracted by the fibrous structure.

9. The illuminating or luminous glazing unit as claimed in claim 8, wherein the waveguide sheet is fixed, by way of a lamination interlayer, to a substrate formed by at least one transparent glazing element.

10. The illuminating or luminous glazing unit as claimed in claim 8, wherein the fibrous structure contains a binder that binds the plurality of fibers in the fibrous structure.

11. The illuminating or luminous glazing unit as claimed in claim 8, wherein the plurality of fibers are randomly distributed in the fibrous structure.

12. An illuminating glazing unit, comprising:
a first glass substrate including a first side and a second side opposite said first side;
a light source arranged to illuminate an edge of the first glass substrate so that light emitted by the light source is guided within a thickness of the first glass substrate;
a fibrous structure arranged over said second side so that the light is extracted from the first side of the first glass substrate by the fibrous structure, the fibrous structure comprising a plurality of fibers extending along different directions in the fibrous structure, and
an adhesive layer arranged between the fibrous structure and the second side.

13. An illuminating or luminous glazing unit comprising:
at least one substrate, formed by at least one glazing element that includes a first main face, a second main face and an edge face;
at least one light source to provide light for illuminating the edge face of the at least one glazing element; and
at least one extraction means for extracting the light from the at least one glazing element, the extraction means being formed by at least one fibrous structure, the at least one fibrous structure comprising a plurality of fibers extending along different directions in the fibrous structure, said fibrous structure arranged over one of the first and the second main faces so that, in use, after passing through the edge face, the light provided by the at least one light source is first guided within a thickness of the at least one glazing element before being extracted, by the at least one fibrous structure.

14. The illuminating or luminous glazing unit as claimed in claim 13, comprising light-emitting diodes as light sources.

15. The illuminating or luminous glazing unit as claimed in claim 13, wherein the extraction means comprises at least one medium encapsulating the fibers in the fibrous structure and/or an adhesive.

16. The illuminating or luminous glazing unit as claimed in claim 13, comprising a diode that is constructed and arranged to receive command signals and/or wherein the at least one light source is coupled to piloting means and/or wherein at least one sensor connected to the environment and/or to the glazing unit is associated with the at least one light source.

17. A method comprising arranging the illuminating or luminous glazing unit as claimed in claim 13 in a transport vehicle, architectural glazing, interior-design glazing or a planar lamp.

18. A process for manufacturing an illuminating or luminous glazing unit as claimed in claim 13, which comprises adding at least one fibrous structure to a structure of the glazing unit.

19. An automotive vehicle incorporating an illuminating or luminous glazing unit as claimed in claim 13.

20. The illuminating or luminous glazing as claimed in claim 13, wherein the glazing element is transparent.

21. The illuminating or luminous glazing unit as claimed in claim 13, wherein at least part of the fibrous structure is formed by a woven, nonwoven or knitted textile.

22. The illuminating or luminous glazing unit as claimed in claim 13, wherein the fibrous structure contains a binder that binds the plurality of fibers in the fibrous structure.

23. The illuminating or luminous glazing unit as claimed in claim 13, wherein the plurality of fibers are randomly distributed in the fibrous structure.

24. The illuminating or luminous glazing unit as claimed in claim 13, wherein the fibrous structure, is, or is formed by, at least one fiber veil.

25. The illuminating or luminous glazing unit as claimed in claim 24, wherein the fiber veil is a glass-fiber veil or optionally a plastic fiber veil.

26. An extraction means arranged as a layer, for extracting light, in an illuminating or luminous glazing unit as claimed in claim 13, said extraction means being formed by a fibrous structure comprising a plurality of fibers extending along different directions in the fibrous structure.

27. A method comprising using an extraction means as claimed in claim 26 for producing an illuminating or luminous glazing unit.

* * * * *